(12) United States Patent
Nakano (10) Patent No.: US 8,298,951 B1
(45) Date of Patent: Oct. 30, 2012

(54) FOOTING REDUCTION USING ETCH-SELECTIVE LAYER

(75) Inventor: Ryu Nakano, Sagamihara (JP)

(73) Assignee: ASM Japan K.K., Tokyo (JP)

( * ) Notice: Subject to any disclaimer, the term of this patent is extended or adjusted under 35 U.S.C. 154(b) by 92 days.

(21) Appl. No.: 13/085,698

(22) Filed: Apr. 13, 2011

(51) Int. Cl.
*H01L 21/311* (2006.01)

(52) U.S. Cl. .......................................... 438/696; 216/46

(58) Field of Classification Search .................... 216/67, 216/696

See application file for complete search history.

(56) References Cited

U.S. PATENT DOCUMENTS

| 2004/0214445 | A1 | 10/2004 | Shimizu et al. | |
| 2011/0183269 | A1* | 7/2011 | Zhu ............................. | 430/319 |

FOREIGN PATENT DOCUMENTS

| JP | 10-0261620 | 9/1998 |
| JP | 2004-134553 | 4/2004 |
| JP | 2004-294638 | 10/2004 |
| JP | 2004-310019 | 11/2004 |
| JP | 2009-016815 | 1/2009 |
| JP | 2009-099938 | 5/2009 |
| JP | 2010-205967 | 9/2010 |

\* cited by examiner

*Primary Examiner* — Roberts Culbert (74) *Attorney, Agent, or Firm* — Snell & Wilmer L.L.P.

(57) ABSTRACT

A method of forming side spacers upwardly extending from a substrate, includes: providing a template constituted by a photoresist formed on and in contact with an etch-selective layer laminated on a substrate; anisotropically etching the template in a thickness direction with an oxygen-containing plasma to remove a footing of the photoresist and an exposed portion of the underlying layer; depositing a spacer film on the template by atomic layer deposition (ALD); and forming side spacers using the spacer film by etching. The etch-selective layer has a substantially lower etch rate than that of the photoresist.

11 Claims, 4 Drawing Sheets

FOOTING REDUCTION USING ETCH-SELECTIVE LAYER

BACKGROUND

1. Field of the Invention

The present invention relates to semiconductor integrated circuit manufacturing and, more particularly to a method of forming side spacers, particularly on space-defined double patterning (SDDP).

2. Description of the Related Art

Photolithography technology has recently faced difficulty of forming patterns having pitches smaller than the submicron level. Various approaches have been studied, and one of the promising methods is space-defined double patterning (SDDP) which makes it possible to create narrow pitches beyond limitations of conventional lithography such as light source wavelength and high index immersion fluid. Generally, SDDP needs one conformal spacer film and hardmask template wherein the conformal spacer film is deposited on the template normally having convex patterns. A silicon oxide layer is commonly used as a conformal spacer, and a hardmask template is typically constituted by photoresist (PR) prepared by a spin-on or CVD process.

As discussed below, the present inventors have recognized several problems in SDDP and developed solutions thereto, which solutions can also be applicable to general patterning processes. Thus, the present invention relates to improvement on general patterning processes using a hardmask, and particularly on SDDP.

Any discussion of problems and solutions involved in the related art has been included in this disclosure solely for the purposes of providing a context for the present invention, and it should not be taken as an admission that any or all of the discussion were known at the time the invention was made.

Figure 1:
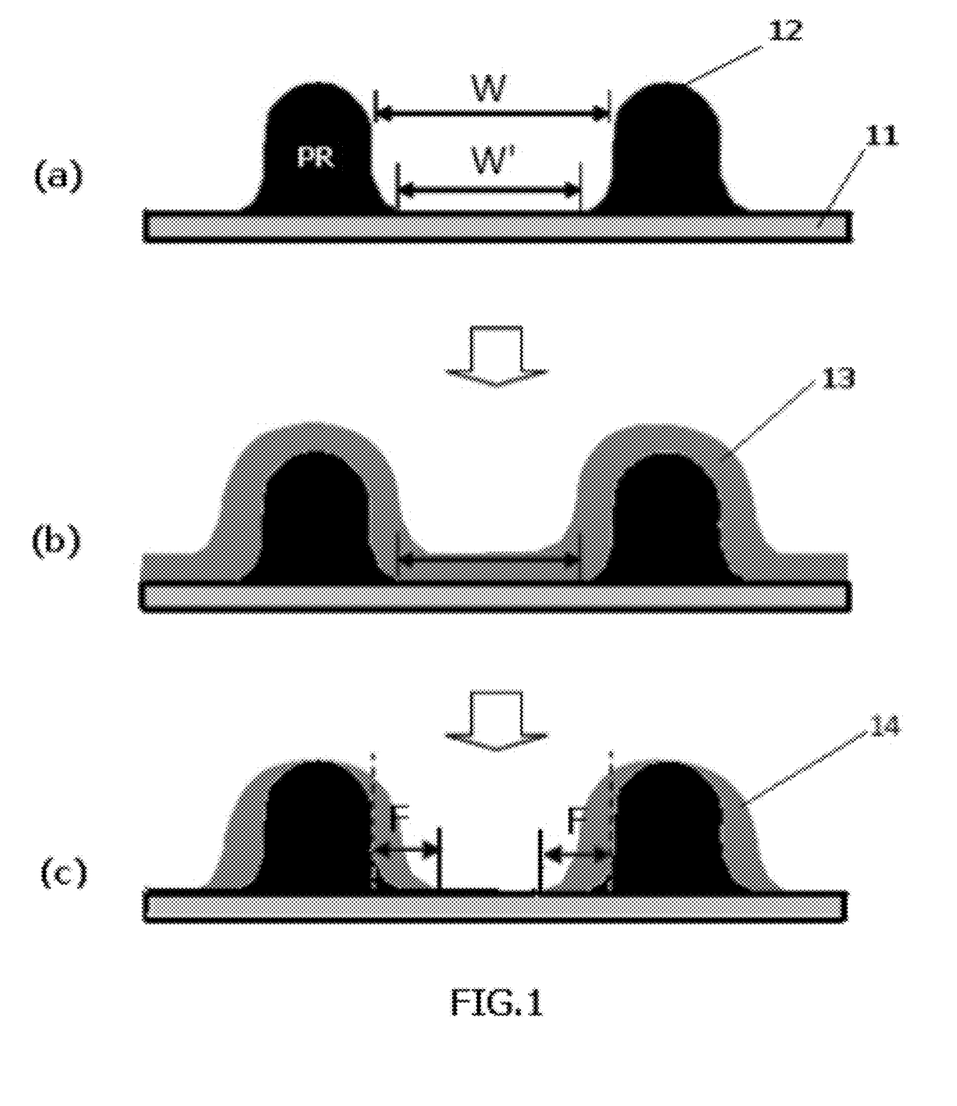
FIG. 1 is a schematic representation illustrating a part of the SDDP sequence of (a) photoresist (PR) patterning, (b) SiO deposition by PE-ALD, and (c) reactive ion etch (RIE).

In SDDP process flow, a photoresist pattern 12 is formed on a substrate 11 as shown in FIG. 1(*a*). When etching a photoresist layer to form the photoresist pattern, each formed photoresist protrusion 12 has a widened footing portion at its bottom, and thus, the distance between the formed photoresist protrusions at their bottoms (W') is shorter than that their side walls (W). When depositing a spacer layer 13 such as a SiO layer by plasma enhanced atomic layer deposition (PE-ALD) over the photoresist pattern as shown in FIG. 1(*b*), the spacer layer 13 deposits along the surface of the photoresist pattern having the widened footing portions. When the spacer layer is etched by, e.g., reactive ion etching (RIE) to remove the top and bottom to form side spacers 14 as shown in FIG. 1(*c*), the widened footings of the photoresist pattern are transferred to the side spacers 14. As a result, the thickness of the side spacer at the bottom appears to be widened (F), which is significantly greater than the thickness of the side spacer itself, thereby causing unexpected critical dimension (CD) changes or the like.

Figure 2:
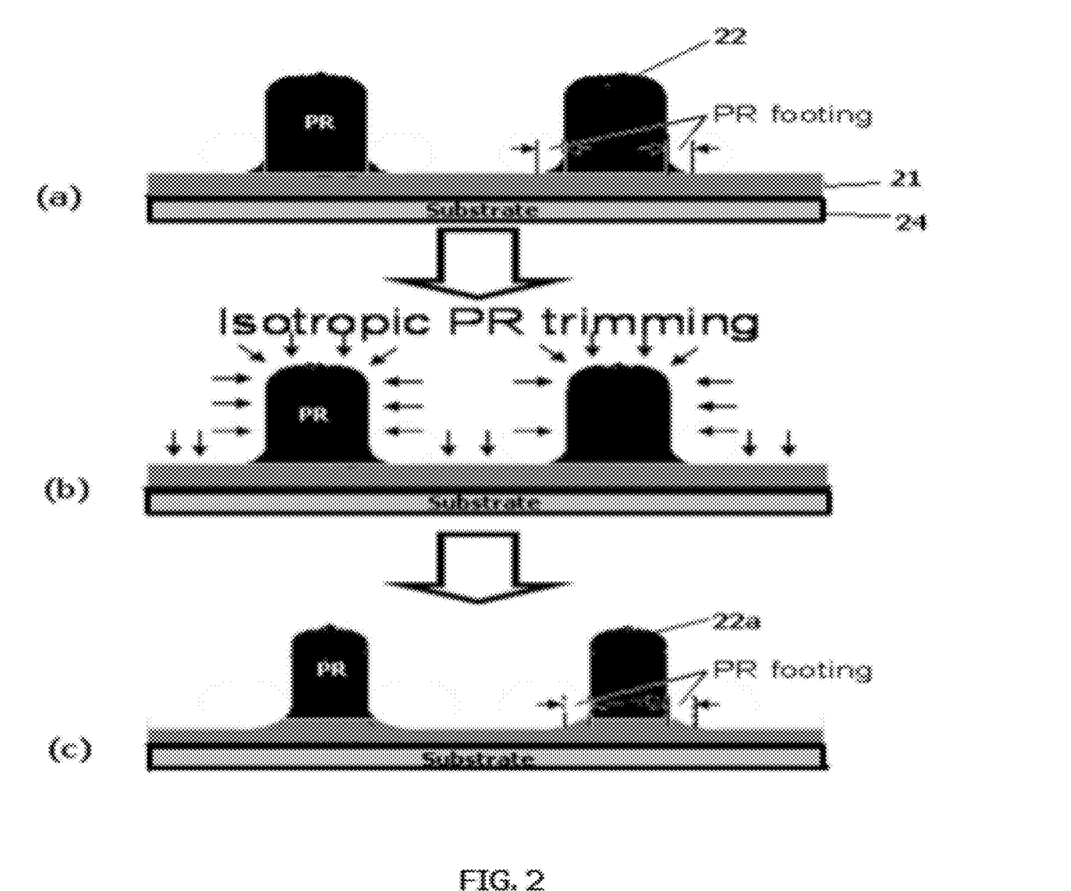
FIG. 2 is a schematic representation illustrating a part of the SDDP sequence of (a) photoresist (PR) patterning, (b) the beginning of isotropic PR trimming, and (c) the end of isotropic PR trimming.

In order to achieve patterning smaller than the resolution limit by, e.g., SDDP, many photoresist trimming techniques such as trimming by plasma have been reported. However, it is still difficult to control the transferred footing shape. For example, by using an underlying layer having an increased etch rate, while trimming a photoresist layer, a mask pattern is formed in the underlying layer (e.g., JP 2004-310019). However, by using a combination of an underlying layer and a photoresist layer, even if the footing of the etched photoresist can be smaller while trimming the etched photoresist, a footing shape is transferred to and formed in the underlying layer. Thus, the footing problem is not solved. FIG. 2 shows this problem. When a photoresist layer which is formed on an underlying layer 21 formed on a substrate 24 is etched, a widened footing is formed in the etched photoresist 22 as shown in FIG. 2(*a*). While trimming the etched photoresist 22 isotropically (FIG. 2(*b*)), the widened footing of the etched photoresist is smaller. However, the footing of the etched photoresist is transferred to the underlying layer as shown in FIG. 2(*c*).

SUMMARY

In some embodiments of the present invention, by conducting plasma irradiation prior to formation of a spacer layer to anisotropically etch a template constituted by a photoresist formed on and in contact with an etch-selective layer laminated on a substrate, said etch-selective layer has a substantially lower etch rate than that of the photoresist, thereby reducing a widened footing of the photoresist.

Some embodiments of the present invention provide a method of forming side spacers upwardly extending from a substrate, comprising: (i) providing a template constituted by a photoresist formed on and in contact with an etch-selective layer laminated on a substrate, said photoresist having footing at a base of the photoresist, said etch-selective layer having a substantially lower etch rate than that of the photoresist; (ii) anisotropically etching the template in a thickness direction with an oxygen-containing plasma to remove the footing of the photoresist and an exposed portion of the underlying layer; (iii) depositing a spacer film on the template by atomic layer deposition (ALD); and (iv) forming side spacers using the spacer film by etching.

In some embodiments, the side spacers are for spacer-defined double patterning (SDDP). In some embodiments, the etch-selective layer has a substantially higher etch rate than that of the side spacers. In some embodiments, the etch-selective layer is constituted by an organic bottom antireflective coating (BARC) formed from a carbon-containing (or carbon- and silicon-containing) compound having a ratio of (number of C, H, and O atoms in total)/(number of C atoms-number of O atoms) which is no more than 5. In some embodiments, the etch-selective layer is constituted by an organic bottom antireflective coating (BARC) having an etch selectivity substantially equivalent to that of a SiN film. In some embodiments, the etch-selective layer is constituted by an inorganic silicon- or carbon-containing layer as an antireflective coating (ARC) and a nitrogen-free oxide layer laminated on the inorganic silicon- or carbon-containing layer. In some embodiments, the spacer film is constituted by $SiO_2$, TiO, or any suitable metal oxide materials (e.g., a co-assigned U.S. Provisional Application No. 61/427,661, the disclosure of which is herein incorporated by reference in its entirety). In some embodiments, an underlying layer formed underneath the etch-selective layer is constituted by amorphous carbon.

In some embodiments, any of the disclosed methods further comprise etching the photoresist of the template to trim the photoresist (e.g., by isotropical etching or any suitable etching) prior to the anisotropical etching, wherein the etch-selective layer has a substantial resistance to the isotropic trimming, and substantially no footing of the photoresist remains. Particularly, when the inorganic ARC is used as the etch-selective layer, substantially no footing can remain. In some embodiments, the anisotropical etching and the deposition of the spacer film are conducted continuously in the same reactor.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purpose and are not necessarily to scale.

DETAILED DESCRIPTION

In this disclosure, "gas" may include vaporized solids and/or liquids and may be constituted by a mixture of gases. In this disclosure, the reactant gas, the additive/carrier gas, and the precursor may be different from each other or mutually exclusive in terms of gas types, i.e., there is no overlap of gases among these categories. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. In this disclosure, any defined meanings do not necessarily exclude ordinary and customary meanings in some embodiments. In the disclosure, "substantially lower", "substantially higher", "substantially different", etc. refer to a difference of at least 10%, 50%, 100%, 200%, 300%, or any ranges thereof, for example. Also, in the disclosure, "substantially the same", "substantially equivalent", "substantially uniform", etc. refer to a difference of less than 20%, less than 10%, less than 5%, less than 1%, or any ranges thereof, for example. The numerical numbers applied in examples may be modified by a range of at least ±50% in other conditions, and further, in this disclosure, any ranges indicated may include or exclude the endpoints. In the present disclosure where conditions and/or structures are not specified, the skilled artisan in the art can readily provide such conditions and/or structures, in view of the present disclosure, as a matter of routine experimentation.

In the disclosure, the "footing" or "widened footing" generally refers to an outwardly extended portion at the bottom of a protrusion relative to the side wall of the protrusion, said extended portion being typically inclined or sloped. The size of the footing may be defined as a difference between the width of the protrusion at about 50% of the height and the width at the bottom. In some embodiments, the "removal of the footing" does not necessarily refer to removal of the entire footing, but refers to removal of a substantial portion of the footing or substantially diminishing the size of the footing.

In the disclosure, the "etch rate" refers to an actual etch rate of a material in process or an etch rate evaluated beforehand which is a dry etch rate ($NF_3$ at 100° C.) or a wet etch rate (DHF at 1:100), depending on the actual process.

In the present disclosure where conditions and/or structures are not specified, the skilled artisan in the art can readily provide such conditions and/or structures, in view of the present disclosure, as a matter of routine experimentation.

In some embodiments, in order to solve at least one or all of the problems discussed above in patterning processes, an etch-selective layer is formed underneath a PR pattern. The etch-selective layer has a substantially lower etch rate than that of the PR, but has a substantially higher etch rate than that of a side spacer. In some embodiments, the etch-selective layer is constituted by an organic BARC which has an etch selectivity substantially equivalent to that of a SiN film. In some embodiments, the BARC is formed from a carbon-containing (or carbon- and silicon-containing) compound having a ratio of (number of C, H, and O atoms in total)/(number of C atoms-number of O atoms) which is no more than 5. The ratio is called "Ohnishi parameter" (J. Electrochem Soc 143, 130 (1983) H. Gokan, S. Esho and Y. Ohnishi, the disclosure of which is herein incorporated by reference in its entirety). In general, the higher the ratio, the higher the concentration of carbon becomes. When the concentration of carbon is high, the etch rate becomes low. For example, hexamethyldisiloxane (HMDSO) has a ratio of 5, hexamethyldisilazane (HMDS) has a ratio of 4.2.

In some embodiments, the etch-selective layer is constituted by an inorganic silicon- or carbon-containing layer and a nitrogen-free oxide layer laminated on the inorganic silicon- or carbon-containing layer. The nitrogen-free oxide layer is used in order to inhibit the occurrence of resist poisoning, and this layer can contribute to suppression of formation of a widened footing (by inhibiting migration of N from the etch-selective layer to the photoresist), but a thinner layer is better (e.g., about 1-3 nm) as long as it is capable of inhibiting contact between the PR and the inorganic silicon- or carbon-containing layer.

In some embodiments, the etch rate refers to chemical resistance (low dry etch rate, $NF_3$ at 100° C.) or a wet etch rate (DHF at 1:100).

Figure 3:
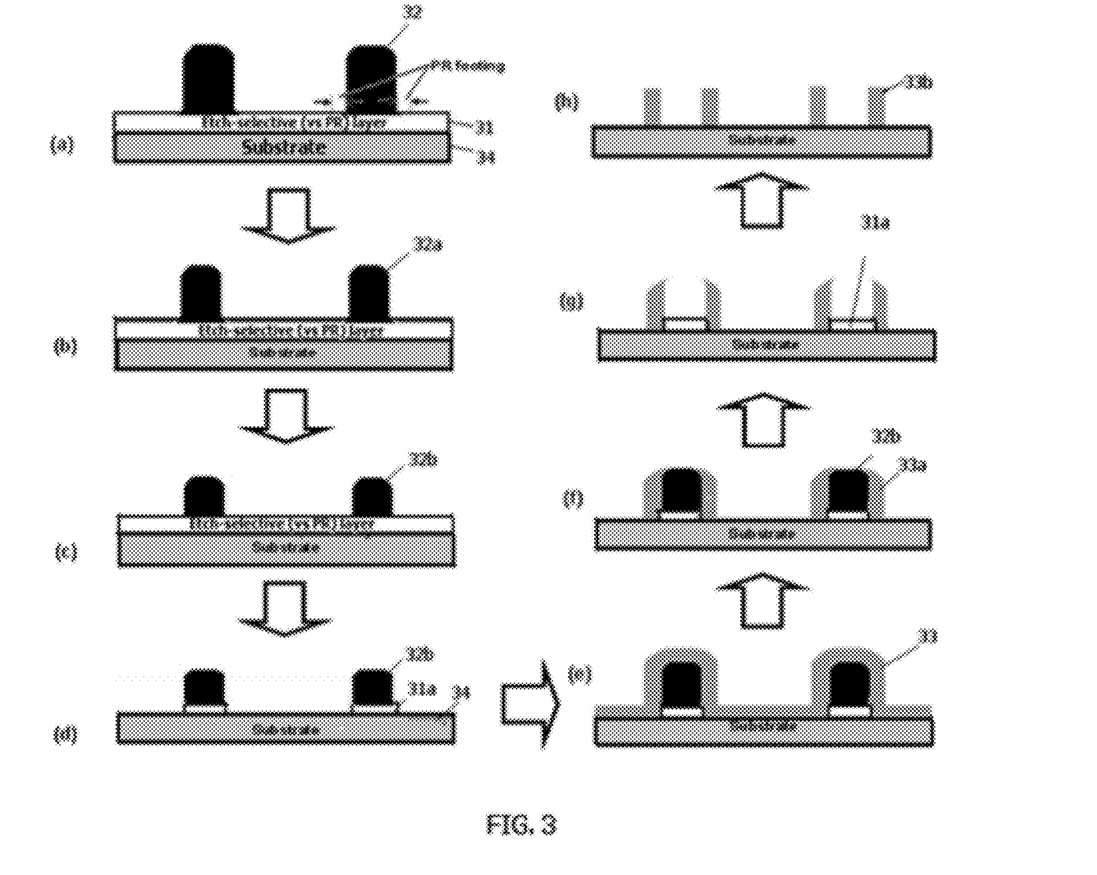
FIG. 3 is a schematic representation illustrating a part of the SDDP sequence of (a) photoresist (PR) patterning, (b) isotropic PR trimming, (c) anisotropic etching (removal of the footing), (d) etching of the etch-selective layer, (e) spacer layer deposition, (f) etching of top and bottom of the etch-selective layer, (g) removal of the PR, and (h) removal of the remaining etch-selective layer and the top of the side spacers, according to an embodiment of the present invention.

FIG. 3 is a schematic representation illustrating a part of the SDDP sequence using a BARC layer as the etch-selective layer, which includes (a) photoresist (PR) patterning, (b) PR trimming (e.g., isotropic trimming), (c) etching (e.g., anisotropic etching) (removal of the footing), (d) etching of the etch-selective layer, (e) spacer layer deposition, (f) etching of top and bottom of the etch-selective layer, (g) removal of the PR, and (h) removal of the remaining etch-selective layer and the top of the side spacers, according to an embodiment of the present invention, which is not intended to limit the invention. In some embodiments, step (b) can be omitted, and in step (c), both PR trimming and footing removal can be accomplished by any suitable etching.

In some embodiments, the sequences of forming a final pattern using a BARC layer as the etch-selective layer are as follows:

1) A BARC layer 31 is formed on a substrate 34. The BARC layer has high etch selectivity relative to a photoresist (PR).

2) A photoresist film material is then applied on the BARC layer, and prebaked, thereby forming a photoresist film. A pattern circuit area of the photoresist film is then exposed to irradiation, and then developed with a developing liquid, thereby forming a photoresist pattern 32 in the photoresist film (FIG. 3 (a)).

3) The photoresist has a widened footing as a result of the patterning. Thus, the photoresist is subjected to isotropic trimming using a plasma generated in an environment where a gas containing oxygen is introduced, thereby forming a trimmed photoresist 32a (FIG. 3(b)). Because the etching speed of the BARC layer is lower than that of the photoresist, the footing of the photoresist is effectively reduced. This trimming can be conducted continuously from the formation of side spacers in the same reactor. The subsequent steps 4) to 7) can also be conducted continuously in the same reactor.

4) The trimming may not sufficiently remove the footing of the photoresist, although a reduction of the footing is significant. Also, in some embodiments, trimming is not performed. Thus, the template (including the substrate, BARC layer, and photoresist) is subjected to anisotropic etching, thereby removing the remaining footing and forming a photoresist 32b without footing (FIG. 3(c)). The anisotropic etching continues to remove the BARC layer, thereby forming the photoresist 32b and etched BARC layer 31a underneath the photoresist (FIG. 3(d)). Because the BARC layer has higher resistance to etching than the photoresist, when the BARC layer is removed, the photoresist is diminished to a certain degree (the height of the photoresist is lowered due to the anisotropic etching). Considering the above, an appropriate etch selectivity of the BARC layer is selected.

5) Next, an ALD film 33 is formed as a side spacer film on the template (FIG. 3(e)). Since the ALD film is deposited on the photoresist, the deposition temperature may be, for example, about 150° C. or lower or about 100° C. or lower, depending on the heat resistance of the photoresist and BARC.

6) The top and bottom portions of the side spacer film 33 are then removed, thereby forming provisional side spacers 33a enclosing the photoresist 32b and the BARC layer 31a underneath the photoresist as a core material (FIG. 3(f)).

7) After the top of the side spacer film, the photoresist 32b is irradiated with an $O_2$-containing plasma (FIG. 3(g)), and the BARC layer 31a is irradiated with the $O_2$-containing plasma (FIG. 3(h)), thereby obtaining a final pattern with side spacers 33b.

In the above, in some embodiments, the photoresist is arranged at a pitch of about 80 nm (±50%). In some embodiments, the side of the photoresist prior to the trimming (FIG. 3(a)) has a height of about 60 nm (±50%), a width of about 26 nm to about 47 nm (±50%), and a footing of about 11.1 nm (±50%). In some embodiments, the side of the photoresist after the trimming (FIG. 3(c)) has a height of about 47 nm (±50%), a width of about 14 nm to about 17 nm (±50%), and a footing of about 0 nm.

In some embodiments, as the organic BARC, a resist used for dry ArF or wet ArF can be used, which can be selected from the group consisting of alicyclic acrylic resin, cycloolefin resin, cyclolefin-maleic anhydride resin, and methacrylate resin. In some embodiments, a BARC having a low Ohnishi parameter (high in carbon concentration) can be used. In some embodiments, a BARC having high silicon concentration ("a Si-rich BARC", e.g., at least 5, 10, or 20 atomic %) can be used. In some embodiments, the etch selectivity of a BARC relative to the photoresist (footing) is adjusted by changing the silicon content of the BARC so that the footing can selectively be etched readily by adjusting the oxygen concentration of an etchant (a Si-rich BARC has effective or substantial resistance to oxygen plasma). As described below, the Si-rich BARC can be etched by fluorine-containing oxygen plasma, whereas the photoresist has effective or substantial resistance to the fluorine-containing oxygen plasma so that the height of the photoresist can effectively or substantially be maintained. In some embodiments, the BARC can be applied by spin coating or further baking after spin coating to vaporize a resist solvent. In some embodiments, the thickness of the BARC is about 10 nm to about 50 nm. If the thickness is lower than the range, it will be difficult to form a layer. On the other hand, if the thickness is greater than the range, when removing the BARC, side spacers may be significantly diminished.

In some embodiments, the trimming and the footing removal etching can be conducted under conditions as follows:

| | | |
|---|---|---|
| Gas containing oxygen | | $O_2$, $N_2O$, and/or $CO_2$ |
| Flow rate (sccm) of Oxygen-containing gas | | About 100 to about 2,000 |
| Inert gas | | Ar, He |
| Flow rate (sccm) of Inert gas | | About 500 to about 1,000 |
| Plasma conditions | Temperature (° C.) | About 50 to about 150, depending on the thermal resistance of RR and BARC |
| | Pressure (Pa) | About 15 to about 800 |
| | RF frequency (MHz) | About 13.56 |
| | RF power (W) | About 30 to about 300 |

When using a gas containing more oxygen (e.g., more than 50% of the gas in volume), the etch rate of the BARC becomes low, whereas the etch rate of the photoresist becomes high. That is, the higher the oxygen content of the etch gas, the lower the etch rate of the BARC becomes.

In some embodiments, the removal of the BARC can be conducted under conditions as follows or the conditions disclosed in JP 10-261620, for example (the disclosure of which is herein incorporated by reference in its entirety):

| | | |
|---|---|---|
| Gas for $O_2$-containing plasma | | $O_2$, $CF_4 + O_2$, $CF_3I + O_2$ |
| Flow rate (sccm) of O2-containing gas | | About 1,000 to about 2,000 ($CF_4$: about 10 to about 100) |
| Plasma conditions | Temperature (° C.) | About 50 to about 150, depending on the thermal resistance of RR and BARC |
| | Pressure (Pa) | About 10 to about 2000 |
| | RF frequency and power | About 2.45 GHz (about 400 to 1,200 W) + about 13.56 MHz (about 30 to 100 W) |

When using a gas containing more oxygen (e.g., more than 50% of the gas in volume), the etch rate of the BARC containing Si becomes low, whereas when using a gas containing lower oxygen concentration, etching effect by florin becomes more significant, thereby increasing etch rate of the BARC (e.g., JP 2010-205967, the disclosure of which is herein incorporated by reference in its entirety).

In some embodiments, the ALD film is selected from the group consisting of SiO, SiN, SiC, SiCN, and TiO. Any suitable ALD methods can be used. In some embodiments, the methods disclosed in a co-assigned application, U.S. patent application Ser. No. 12/901,323, can be used (the disclosure of which is herein incorporated by reference in its entirety). For example, as a process gas, a combination of BDEAS (bis(diethylamino)silane), $O_2$ (500 sccm), He (200 sccm), and Ar (2500 sccm) can be used. In some embodiments, the pressure is about 200 Pa (±50%), and RF frequency (about 13.56 MHz±50%), power (about 50 W±50%), and duration (about 0.4 seconds±50%) may be used. After stabilizing the pressure and gas flows in the reactor, the precursor is introduced into the reactor for a certain time period to cause the precursor to adsorb on the surface of a substrate, followed by purging the remaining precursor with another gas. RF plasma is then applied to the substrate, thereby oxidizing the adsorbed precursor. The above steps constitute one cycle, and by repeating the cycle, an ALD film such as a SiO film having a desired thickness can be formed on the substrate.

In some embodiments, a pulse control valve can realize the pulsing of the precursor and/or the inert/additive gas. Further, RF power can be pulsed. In the above, the pulsing of the RF power can be accomplished by adjusting a matching box (not shown). The RF power requires a minimum time period for discharging, which is typically as short as 8 msec. Thus, by adjusting the matching box, the duration of the RF power can easily be controlled at about 0.1 sec, for example. In some embodiments, the average thickness deposited per cycle may be about 0.05 nm/cycle to about 0.2 nm/cycle. The pulse supply of the precursor can be continued until a desired thickness of film is obtained. If the desired thickness is about 20 nm to about 100 nm, about 100 cycles to about 2,000 cycles (e.g., about 200 to about 1,000 cycles) may be conducted.

In some embodiments, the removal of the top and bottom of the ALD film can be conducted under conditions shown below:

| | |
|---|---|
| Etching gas | $CHF_3$, $CF_4$, $C_2F_6$ |
| Flow rate (sccm) of etching gas | About 10 to about 100 |
| Additive gas | Ar, $O_2$ |
| Flow rate (sccm) of additive gas | About 10 to about 100 |
| Plasma conditions | Temperature (° C.) | About 50 to about 150, depending on the thermal resistance of RR and BARC |
| | Pressure (Pa) | Less than about 1 |
| | RF frequency (MHz) | About 13.56 |
| | RF power (W) | About 50 to about 300 |

In some embodiments, the removal of the enclosed photoresist and BARC through the opened top can be conducted under conditions shown below.

| | |
|---|---|
| Gas for $O_2$-containing plasma | $O_2$, $CF_4$ + $O_2$ |
| Flow rate (sccm) of $O_2$-containing gas | About 1,000 to about 2,000 ($CF_4$: about 10 to about 100) |
| Plasma conditions | Temperature (° C.) | About 50 to about 150, depending on the thermal resistance of RR and BARC |
| | Pressure (Pa) | About 100 to about 200 |
| | RF frequency and power | About 2.45 GHz (about 400 to 1,200 W) + about 13.56 MHz (about 30 to 100 W) |

In some embodiments, in order to remove the enclosed photoresist through the opened top, a gas containing a high concentration (more than 50% in volume) of oxygen can be used. After the completion of the removal of the enclosed photoresist, in order to remove the BARC containing Si, a gas containing a low concentration (less than 50% in volume) of oxygen can be used, wherein the plasma can be intermittently or continuously applied. If it takes a long time to remove the BARC including Si, the side spacers may be diminished. Thus, considering the above, the oxygen concentration (oxygen flow rate) should be appropriately selected.

Figure 4:
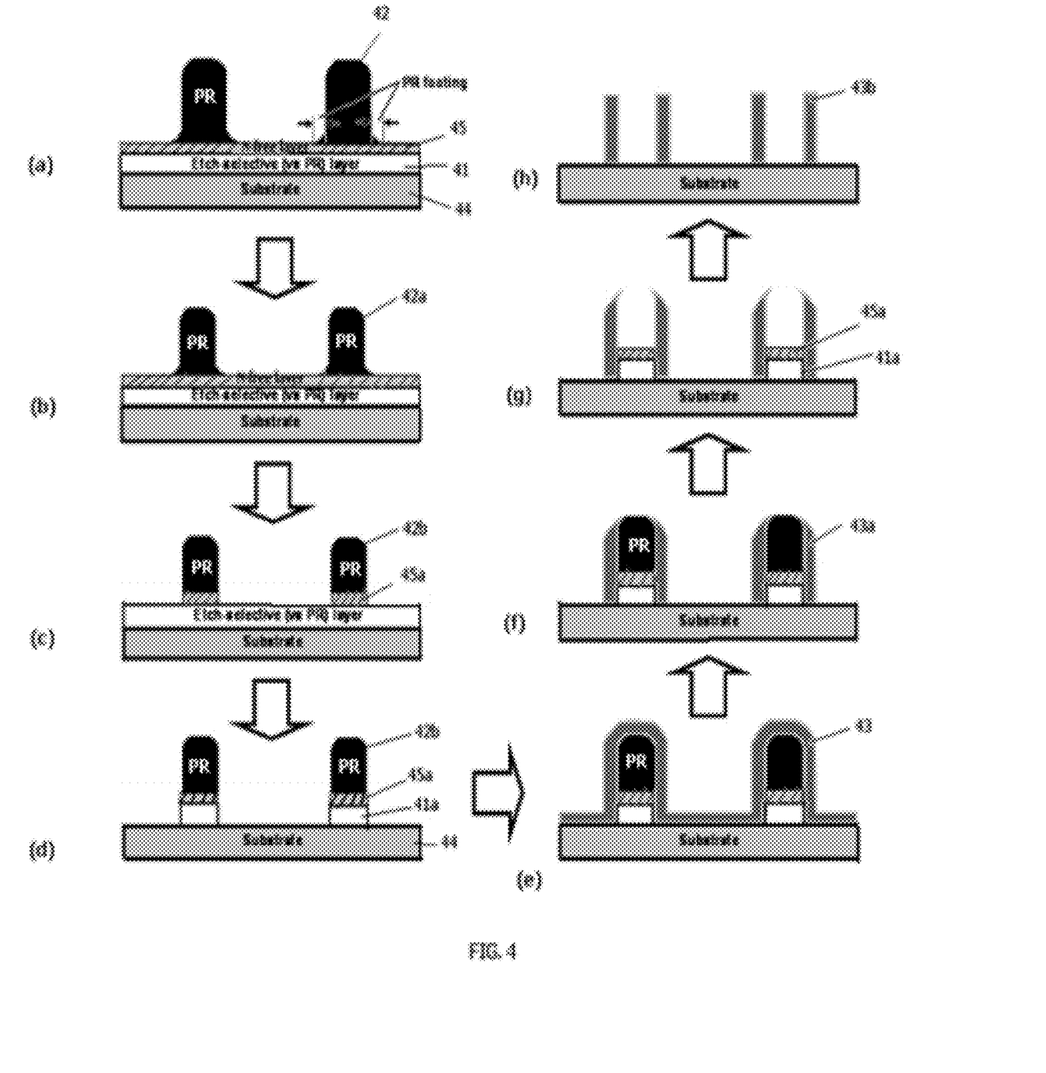
FIG. 4 is a schematic representation illustrating a part of the SDDP sequence of (a) photoresist (PR) patterning, (b) isotropic PR trimming, (c) anisotropic etching (removal of the footing and the N-free layer), (d) etching of the etch-selective layer, (e) spacer layer deposition, (f) etching of top and bottom of the etch-selective layer, (g) removal of the PR, and (h) removal of the remaining N-free layer and etch-selective layer and the top of the side spacers, according to an embodiment of the present invention.

FIG. 4 is a schematic representation illustrating a part of the SDDP sequence using a SiN layer as the etch-selective layer, which includes (a) photoresist (PR) patterning, (b) isotropic PR trimming, (c) anisotropic etching (removal of the footing and the N-free layer), (d) etching of the etch-selective layer, (e) spacer layer deposition, (f) etching of top and bottom of the etch-selective layer, (g) removal of the PR, and (h) removal of the remaining N-free layer and etch-selective layer and the top of the side spacers, according to an embodiment of the present invention.

In some embodiments, the sequences of forming a final pattern using a SiN layer as the etch-selective layer are as follows:

1) A SiN film 41 is formed on a substrate 44. The SiN film has high etch selectivity relative to a photoresist (PR). The reason for using the SiN film instead of e.g., a SiON film is that it is easier to set substantially different etch selectivity of the SiN film, not only from that of a photoresist but also from that of a SiO film constituting side spacers.

2) Next, a super thin SiO film 45 (N-free film) is formed on the SiN film. Alternatively, by oxidation of the surface of the SiN film by e.g., $O_2$ or $N_2O$ plasma treatment or other oxidation methods, the surface of the SiN film can become N-free. By using the N-free film, promotion of formation of a widened footing can be suppressed. If a photoresist is in contact directly with the SiN film, footing may be promoted due to the influence of base group including nitrogen during lithography after formation of a photoresist film. However, if the N-free film is thick, when removing the N-free film in a subsequent step of removing the photoresist and the SiN film after removing the top of a side spacer film, the side spacers may also be diminished (i.e., lowering the height of the side spacers). Thus, it is preferable to make the film thin (e.g., about 1-3 nm).

3) The SiN film 45 and the N-free film 41 also serve as an antireflective film (inorganic ARC).

4) Next, a photoresist film material is then applied on the N-free film and the SiN film, and prebaked, thereby forming a photoresist film. A pattern circuit area of the photoresist film is then exposed to irradiation, and then developed with a developing liquid, thereby forming a photoresist pattern 42 in the photoresist film (FIG. 4 (a)).

5) The photoresist has a widened footing as a result of the patterning. Thus, the photoresist is subjected to isotropic trimming using a plasma generated in an environment where a gas containing oxygen is introduced, thereby forming a trimmed photoresist 42a (FIG. 4(b)). Because the etching speed of the SiN film is lower than that of the photoresist, the footing of the photoresist is effectively reduced (although FIG. 4(b) shows that the N-free film is maintained, through the trimming, most portions of the N-free film may be removed as the footing is reduced). This trimming can be conducted continuously from the formation of side spacers in the same reactor. The subsequent steps 6) to 10) can also be conducted continuously in the same reactor.

6) The trimming may not sufficiently remove the footing of the photoresist, although a reduction of the footing is significant. Also, in some embodiments, trimming is not performed. Thus, the template (including the substrate, SiN film, and photoresist) is subjected to anisotropic etching, thereby removing the remaining footing and forming a photoresist 42b and the etched N-free film 45a underneath the photoresist without footing (FIG. 4(c)). The anisotropic etching continues to remove the SiN film, thereby forming the photoresist 42b, etched N-free film 45a, and etched SiN film 41a underneath the photoresist (FIG. 4(d)). Because the SiN film has higher resistance to etching than the photoresist, when the SiN film is removed, the photoresist is diminished to a certain degree (the height of the photoresist is lowered due to the anisotropic etching). Considering the above, an appropriate etch selectivity of the SiN film is selected.

7) Next, an ALD film 43 is formed as a side spacer film on the template (FIG. 4(e)). Since the ALD film is deposited on the photoresist, the deposition temperature may be about 100° C. or lower.

8) The top and bottom portions of the side spacer film 43 are then removed, thereby forming provisional side spacers 43a enclosing the photoresist 42b, the N-free film 45a, and the SiN film 41a underneath the photoresist as a core material (FIG. 4(f)).

9) After the top of the side spacer film is removed, the photoresist 42b is irradiated with an $O_2$-containing plasma (FIG. 4(g)).

10) After the photoresist 42b is removed, in order to remove the N-free film 45a and the SiN film 41a, they are irradiated with a plasma generated in an environment with a gas containing florin (FIG. 4(h)), thereby obtaining a final pattern with side spacers 43b.

In some embodiments, the substrate on which the etch-selective layer is formed can be made of poly-silicon or amorphous carbon or other carbon materials. When amorphous carbon is used as the substrate without the etch-selective layer disclosed herein, the amorphous carbon is etched while removing an underlying layer, and as a result, a footing is transferred to the amorphous carbon. In some embodiments, the substrate made of amorphous carbon is used without formation of footing.

In some embodiments, the process conditions for the sequence using the inorganic ARC as the etch-selective layer can be similar to or the same as those for the sequence using the organic BARC as the etch-selective layer as described earlier, unless stated otherwise.

In some embodiments, the inorganic ARC can be formed by CVD or ALD. In some embodiments, the thickness of the inorganic ARC is about 5 nm to about 10 nm. In some embodiments, the inorganic ARC may be selected from the group consisting of SiN, SiC, SiCN, and TiO.

In some embodiments, the N-free film can be formed by TEOS-Based CVD or ALD-SiO. In some embodiments, the thickness of the SiO film may be about 1 nm to about 3 nm. The thinner the better, as long as the film can prevent the photoresist and the SiN film from contacting each other. In some embodiments, the N-free film can be formed by an $O_2$ plasma (e.g., using $O_2$ gas at a flow rate of 1,000 sccm and an RF power (13.56 MHz) of about 100 to about 500 W at a temperature of about 50-150° C. under a pressure of about 150-800 Pa for a duration of about 10 to about 180 seconds).

The temperature depends on the thermal resistance of the photoresist and BARC. In some embodiments, the depth of oxidation by the $O_2$ plasma is about 3 nm. In some embodiments, the N-free film can be formed by a $N_2O$ plasma under conditions corresponding to the $O_2$ plasma. In some embodiments, the depth of oxidation by the $N_2O$ plasma is about 3 nm.

In some embodiments, the trimming and the footing removal etching can be conducted under conditions corresponding to those used for the sequence for the organic BARC.

In some embodiments, the removal of the N-free film and the SiN film can be conducted under conditions shown below.

| | |
|---|---|
| Etching gas | $CHF_3$, $CF_4$, $C_2F_6$ (low flow of oxygen) |
| Flow rate (sccm) of etching gas | About 10 to about 100 |
| Additive gas | Ar, $O_2$ |
| Flow rate (sccm) of additive gas | About 10 to about 100 |
| Plasma conditions Temperature (° C.) | About 50 to about 150, depending on the thermal resistance of RR and BARC |
| Pressure (Pa) | Less than about 1 |
| RF frequency (MHz) | About 13.56 |
| RF power (W) | About 30 to about 300 |

In some embodiments, in order to remove the inorganic films (N-free film (SiO) and SiN), a gas containing a low concentration of oxygen is used.

In some embodiments, the ALD film can be formed under conditions corresponding to those used for the sequence for the organic BARC.

In some embodiments, the removal of the top and bottom of the ALD film can be conducted under conditions corresponding to those used for the sequence for the organic BARC.

In some embodiments, the removal of the enclosed photoresist, N-free film, and SiN film through the opened top can be conducted under conditions corresponding to those used for the sequence for the organic BARC.

In some embodiments, in order to remove the enclosed photoresist through the opened top, a gas containing a high concentration (more than 50% in volume) of oxygen can be used. After the completion of the removal of the enclosed photoresist, in order to remove the N-free film and SiN film, a gas containing a low concentration (less than 50% in volume) of oxygen can be used, wherein the plasma can be intermittently or continuously applied. If it takes a long time to remove the N-free film and SiN film, the side spacers may be diminished. Thus, considering the above, the oxygen concentration (oxygen flow rate) should be appropriately selected.

A remote plasma unit can be connected to the apparatus, through which an etching gas or a process gas can be supplied to the interior of the apparatus through a showerhead.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A method of forming side spacers upwardly extending from a substrate, comprising:
    providing a template constituted by a photoresist formed on and in contact with an etch-selective layer laminated on a substrate, said photoresist having footing at a base of the photoresist, said etch-selective layer having a substantially lower etch rate than that of the photoresist;

anisotropically etching the template in a thickness direction with an oxygen-containing plasma to remove the footing of the photoresist and an exposed portion of the underlying layer;

depositing a spacer film on the template by atomic layer deposition (ALD); and forming side spacers using the spacer film by etching.

2. The method according to claim 1, wherein the side spacers are for spacer-defined double patterning (SDDP).

3. The method according to claim 1, wherein the etch-selective layer has a substantially higher etch rate than that of the side spacers.

4. The method according to claim 1, wherein the etch-selective layer is constituted by an organic bottom antireflective coating (BARC) formed from a carbon/silicon-containing compound having a ratio of (number of C, H, and O atoms in total)/(number of C atoms−number of O atoms) which is no more than 5.

5. The method according to claim 1, wherein the etch-selective layer is constituted by an organic bottom antireflective coating (BARC) having an etch selectivity substantially equivalent to that of a SiN film.

6. The method according to claim 1, wherein the etch-selective layer is constituted by an inorganic silicon- or carbon-containing layer as an antireflective coating (ARC) and a nitrogen-free oxide layer laminated on the inorganic silicon- or carbon-containing layer.

7. The method according to claim 1, further comprising etching the photoresist of the template to trim the photoresist prior to the anisotropical etching, wherein the etch-selective layer has a substantial resistance to the trimming, and substantially no footing of the photoresist remains.

8. The method according to claim 1, wherein the anisotropical etching and the deposition of the spacer film are conducted continuously in the same reactor.

9. The method according to claim 1, wherein the spacer film is constituted by $SiO_2$ or TiO.

10. The method according to claim 1, wherein an underlying layer formed underneath the etch-selective layer is constituted by amorphous carbon.

11. The method according to claim 1, wherein the etch-selective layer is constituted by a Si-rich organic bottom antireflective coating (BARC), and the anisotropical etching comprises trimming the photoresist and removing the footing by an oxygen-containing plasma, and then etching the Si-rich BARC by a fluorine-containing oxygen plasma.

* * * * *